US012456951B1

(12) United States Patent
Lin et al.

(10) Patent No.: US 12,456,951 B1
(45) Date of Patent: Oct. 28, 2025

(54) QUARTZ OSCILLATOR AND MANUFACTURING METHOD THEREOF

(71) Applicant: TXC Corporation, Taipei (TW)

(72) Inventors: Cheng-Wei Lin, Taipei (TW); Chih-Hung Chiu, Taipei (TW)

(73) Assignee: TXC Corporation, Taipei (CN)

( * ) Notice: Subject to any disclaimer, the term of this patent is extended or adjusted under 35 U.S.C. 154(b) by 0 days.

(21) Appl. No.: 18/646,739

(22) Filed: Apr. 25, 2024

(30) Foreign Application Priority Data

Mar. 19, 2024 (TW) .................. 113110069

(51) Int. Cl.
*H03B 5/32* (2006.01)
*H10N 30/03* (2023.01)

(52) U.S. Cl.
CPC ............... *H03B 5/32* (2013.01); *H10N 30/03* (2023.02)

(58) Field of Classification Search
CPC .................................. H03B 5/32; H10N 30/03
USPC ................ 29/25.35; 216/38; 331/108 C, 158
See application file for complete search history.

(56) References Cited

U.S. PATENT DOCUMENTS

2011/0062827 A1\* 3/2011 Ichikawa ............. H03H 9/0595
29/25.35

FOREIGN PATENT DOCUMENTS

| CN | 111988009 | 6/2023 |
|---|---|---|
| JP | 2002335142 | 11/2002 |
| JP | 2003110388 | 4/2003 |
| JP | 2003174325 | 6/2003 |
| JP | 2006157872 | 6/2006 |
| JP | 2007158566 | 6/2007 |
| JP | 2007165503 | 6/2007 |
| JP | 2011066566 | 3/2011 |
| JP | 2011087272 | 4/2011 |
| JP | 2011087275 | 4/2011 |
| JP | 2011091787 | 5/2011 |
| JP | 5272651 | 8/2013 |
| JP | 2017079438 | 4/2017 |
| WO | 2024027734 | 2/2024 |

OTHER PUBLICATIONS

"Office Action of Japan Counterpart Application", issued on Feb. 18, 2025, p. 1-p. 4.
"Office Action of Taiwan Counterpart Application", issued on Nov. 22, 2024, p. 1-p. 5.

\* cited by examiner

*Primary Examiner* — Arnold M Kinkead
(74) *Attorney, Agent, or Firm* — JCIPRNET

(57) ABSTRACT

A quartz oscillator including a first plate, a second plate, and a quartz sheet is provided. The quartz sheet has an oscillation zone. The quartz sheet is disposed between the first plate and the second plate. The quartz oscillator has a first outer surface, a side surface, and a first connection surface. The first outer surface is located on the first plate. The first connection surface is located between the first outer surface and the side surface. The first outer surface, the side surface, and the first connection surface are not parallel to each other. A manufacturing method of a quartz oscillator is also provided.

10 Claims, 5 Drawing Sheets

QUARTZ OSCILLATOR AND MANUFACTURING METHOD THEREOF

CROSS-REFERENCE TO RELATED APPLICATION

This application claims the priority benefit of Taiwan application serial no. 113110069, filed on Mar. 19, 2024. The entirety of the above-mentioned patent application is hereby incorporated by reference herein and made a part of this specification.

BACKGROUND

Technical Field

The disclosure relates to an electronic component and a manufacturing method thereof, and in particular to a quartz oscillator and a manufacturing method thereof.

Description of Related Art

A quartz oscillator is an electronic component used to generate an oscillation frequency. The manufacturing method thereof is generally to appropriately pattern the corresponding quartz plate to form an appropriate oscillation zone. Then, it is packaged and singulated to become a corresponding quartz oscillator.

With the trend of electronic products becoming thinner and smaller, the size of the quartz oscillators is bound to be reduced accordingly. However, as the size of quartz oscillators shrinks, the impact of defects in the manufacturing process of the quartz oscillators may also be magnified. Therefore, how to improve the quality or reliability of quartz oscillators is actually a research topic.

SUMMARY

The disclosure provides a quartz oscillator and a manufacturing method of the quartz oscillator, which have proper quality or reliability.

The quartz oscillator of the disclosure includes a first plate, a second plate, and a quartz sheet. The quartz sheet has an oscillation zone. The quartz sheet is located between the first plate and the second plate. The quartz oscillator has a first outer surface, a side surface, and a first connection surface. The first outer surface is located on the first plate. The first connection surface is located between the first outer surface and the side surface. The first outer surface, the side surface, and the first connection surface are not parallel to each other.

In an embodiment of the disclosure, the first plate is made of quartz, and the first outer surface is parallel to a lattice surface of a quartz material of the first plate.

In an embodiment of the disclosure, in a top view state, the quartz oscillator has a first side, a second side, a third side, and a fourth side. A round corner is between the connected two of the first side, the second side, the third side, and the fourth side.

In an embodiment of the disclosure, the quartz oscillator further has a second outer surface and a second connection surface. The second outer surface is located on the second plate. The second connection surface is located between the second outer surface and the side surface. The second outer surface, the side surface, and the second connection surface are not parallel to each other.

In an embodiment of the disclosure, the second plate is made of quartz, and the second outer surface is parallel to the lattice surface of the quartz material of the second plate.

The manufacturing method of the quartz oscillator of the disclosure includes: providing a stacked structure, which includes the first plate, the second plate, and the quartz sheet located between the first plate and the second plate; sequentially performing the first process and the second process on the stacked structure: one of the first process and the second process includes a wet etching process; and another one of the first process and the second process does not include the wet etching process.

In an embodiment of the disclosure, the first process includes the wet etching process, and the second process does not include the wet etching process.

In an embodiment of the disclosure, the manufacturing method of the quartz oscillator further includes performing a third process after the second process, and the third process includes the wet etching process.

In an embodiment of the disclosure, the first process does not include the wet etching process, and the second process includes the wet etching process.

In an embodiment of the disclosure, the wet etching process included in one of the first process and the second process forms an etching surface with an asymmetrical profile on the outer surface of the first plate or the second plate.

Based on the above, through the corresponding wet etching process, the quartz oscillator and the manufacturing method of the quartz oscillator can have proper quality or reliability.

DESCRIPTION OF THE EMBODIMENTS

Figure 1:
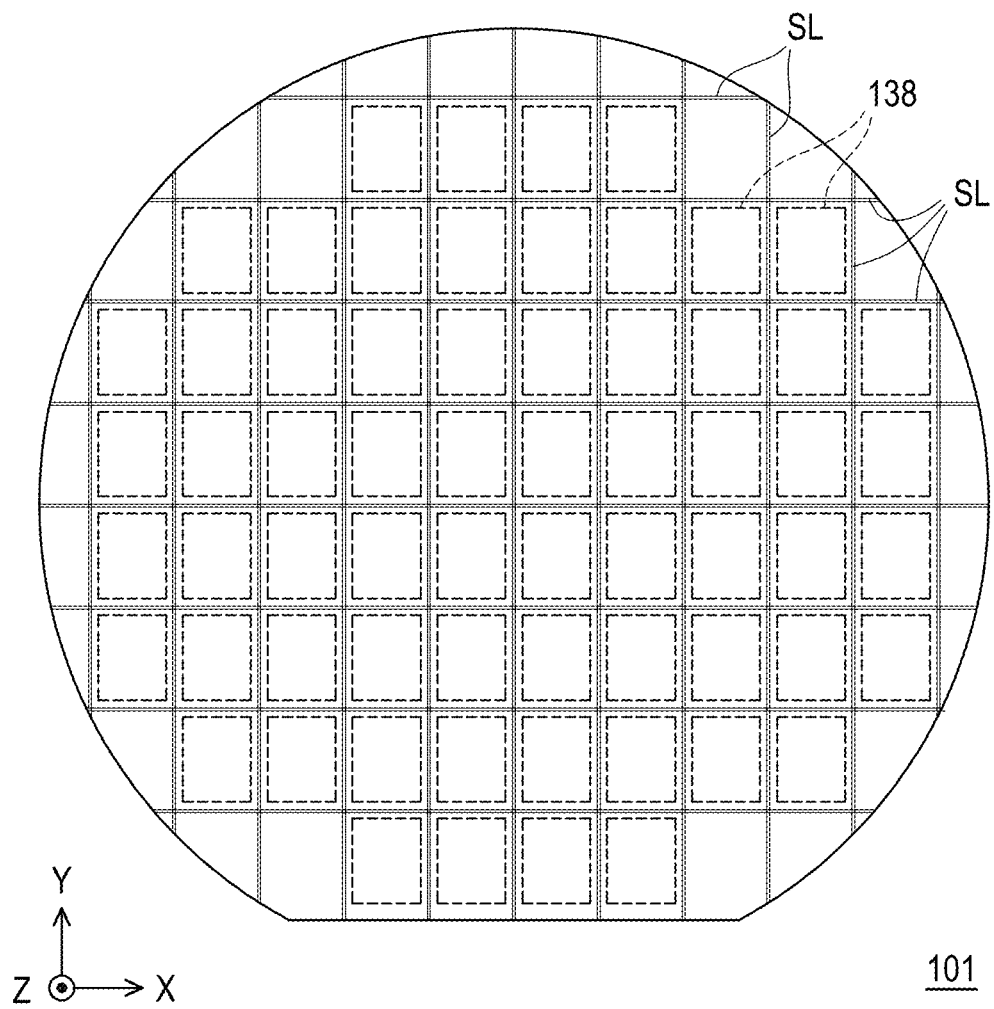
FIG. 1 is a partial top view of a partial manufacturing method of a quartz oscillator according to an embodiment of the disclosure.

In the drawings, the size or aspect of some components or layers may be exaggerated, reduced, or exaggerated for clarity. For example, the inclined area and/or related dimensions (thickness of some components, number or extent of damage or cracks) may be exaggeratedly illustrated in subsequent drawings.

In addition, the directional terms mentioned in the specification, such as up or down, are only for reference to the directions in the drawings. Therefore, unless otherwise stated, the directional terms is used for purposes of illustration and is in no way limiting. Moreover, in order to clearly express the directional relationship between different diagrams, the Cartesian coordinate system (that is, XYZ rectangular coordinate system) is used as an example in some diagrams to represent the corresponding direction, but the disclosure is not limited thereto.

FIG. 1 is a partial top view of a partial manufacturing method of a quartz oscillator according to an embodiment of the disclosure. FIGS. 2 to 5 are partial cross-sectional schematic diagrams of a partial manufacturing method of a quartz oscillator according to an embodiment of the disclosure.

Figure 2:
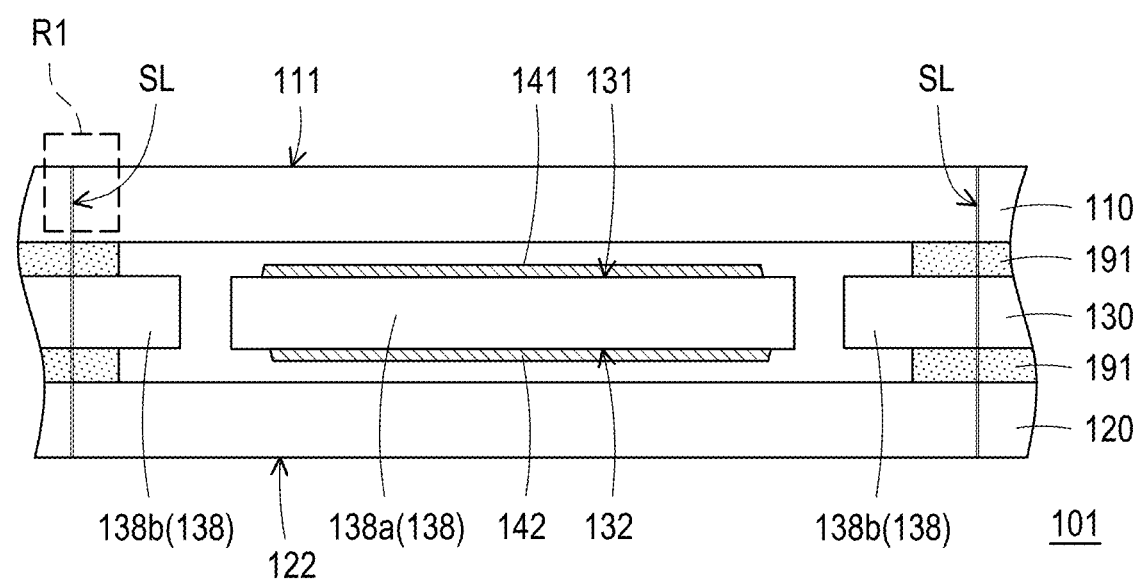
FIGS. 2 to 5 are partial cross-sectional schematic diagrams of a partial manufacturing method of a quartz oscillator according to an embodiment of the disclosure.

Referring to FIGS. 1 and 2, a stacked structure 101 is provided. The stacked structure 101 includes a first plate 110, a quartz sheet 130, and a second plate 120.

In an embodiment, the quartz sheet 130 may be formed of a quartz wafer. The quartz wafer or the corresponding formed quartz wafer may have a corresponding flat or a notch, but the disclosure is not limited thereto.

The quartz sheet 130 may be divided into multiple element zones 138. Each of the element zones 138 may have a corresponding oscillation zone 138a and a surrounding zone 138b. A pattern and/or a thickness of the oscillation zone 138a may be adjusted according to the requirements of a corresponding quartz oscillator 100. For example, the thickness of the oscillation zone 138a may be approximately 20 micrometers (μm) to 50 micrometers.

The quartz sheet 130 may have a corresponding patterned conductive layer. For example, a first surface 131 of the quartz sheet 130 (at the top of the drawing) may have a corresponding first conductive layer 141. The second surface 132 of the quartz sheet 130 (at the bottom of the drawing) may have a corresponding second conductive layer 142. A layout design of the first conductive layer 141 or the second conductive layer 142 may be adjusted according to the requirements of the corresponding quartz oscillator (such as the quartz oscillator 100 marked in FIG. 6 or other similar quartz oscillators). The disclosure is not limited thereto. For example, part of the first conductive layer 141 and part of the second conductive layer 142 may be located on opposite sides of the oscillation zone 138a.

Figure 5:
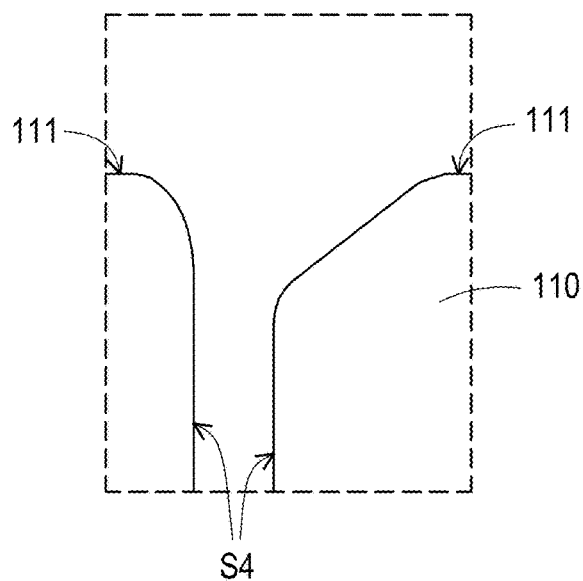
Figure 6:
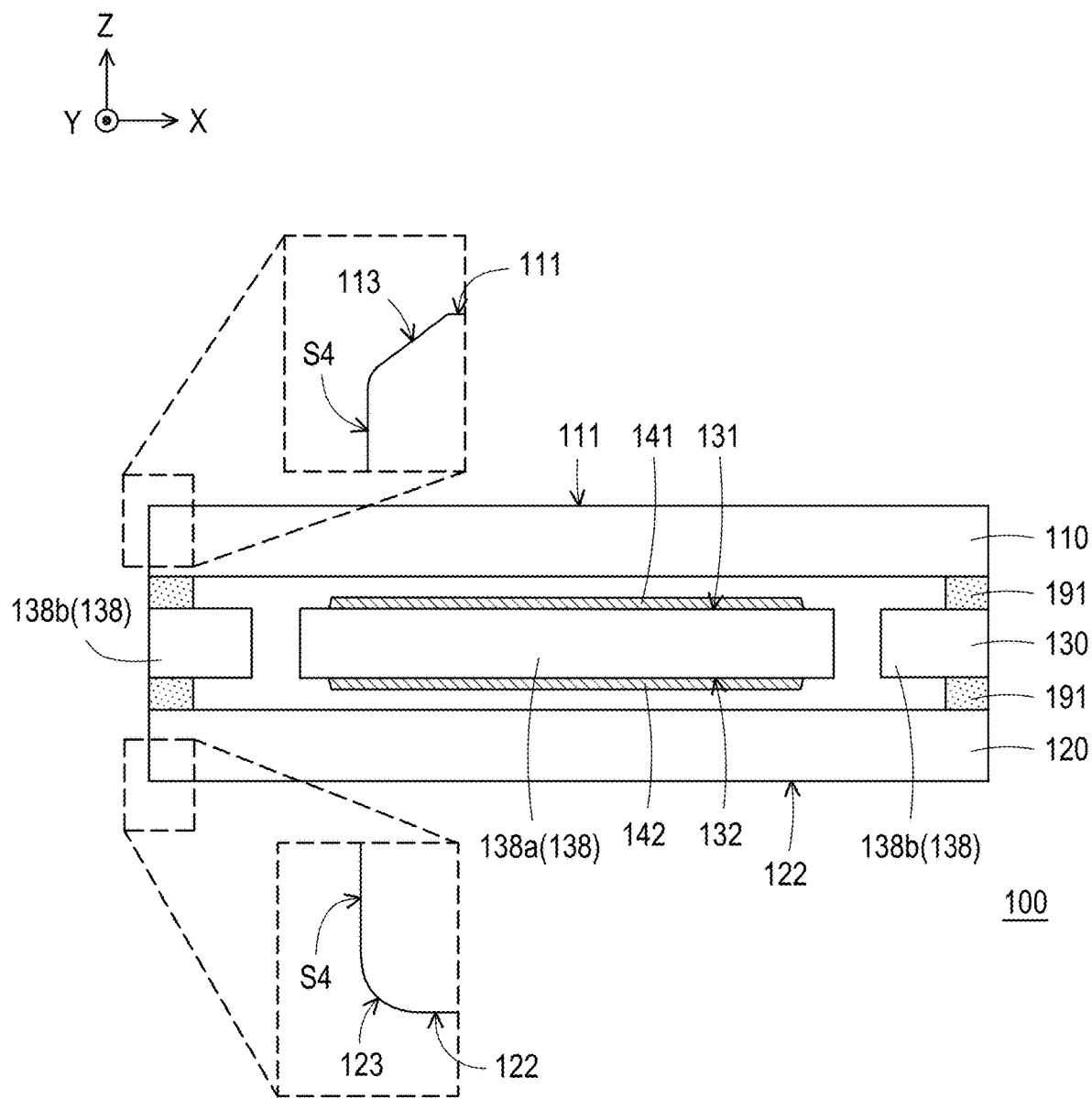
FIG. 6 is a schematic cross-sectional view of a quartz oscillator according to an embodiment of the disclosure.

In subsequent processes, appropriate processes may be performed on each of the element zones 138 to make each of the element zones 138 a corresponding quartz oscillator (such as the quartz oscillator 100 marked in FIG. 6 or other similar quartz oscillators). In addition, for the sake of simplicity, not all element zones 138 are marked one by one in FIG. 1. Moreover, a single element zone 138 is shown or described in subsequent cross-sectional views (e.g., FIGS. 2 to 5).

The quartz sheet 130 is located between the first plate 110 and the second plate 120. In an embodiment, the first plate 110 or the second plate 120 may be directly or indirectly connected to the opposite sides of the quartz sheet 130. For example, there may be a corresponding sealing material or a sealing ring 191 between the first plate 110 and the quartz sheet 130 or between the second plate 120 and the quartz sheet 130. For another example, a part of the first plate 110 or a part of the second plate 120 may directly contact part of the quartz sheet 130. In an embodiment, there is no specific relationship between the thickness of the first plate 110, the thickness of the second plate 120, and the thickness of the quartz sheet 130.

In an embodiment, the first plate 110 or the second plate 120 may have appropriate circuits (not shown), but the disclosure is not limited thereto. The circuits may include, but are not limited to: circuits located on a single surface of the plate, circuits located on two opposite surfaces, and/or conductive vias penetrating the plate. The layout design of the circuit may be adjusted according to requirements and is not limited in the disclosure.

In an embodiment, the material of the first plate body 110 or the second plate body 120 may include quartz or other suitable materials, but the disclosure is not limited thereto. In an embodiment, in an top view state (as shown in FIG. 1), a size, a shape, or a profile of the first plate 110 or the second plate 120 may be the same as or similar to the quartz sheet 130.

In an embodiment, the stacked structure 101 may be divided into multiple zones by a corresponding scribe line SL. Part of the zones divided by the scribe line SL may correspond to the element zones 138. The scribe line SL may be divided virtually; or may be divided physically. For example, the stacked structure 101 may be divided programmatically or graphically using appropriate equipment (such as a machine applied in subsequent cutting steps). For another example, as shown in FIG. 1, the corresponding scribe line SL may be distinguished or judged through appropriate marking lines or structural differences. It is worth noting that in FIG. 1, the scribe line SL is exemplarily marked on a plate, but the disclosure is not limited thereto. The scribe line SL may be divided into corresponding divisions on the first plate 110, the quartz sheet 130, and/or the second plate 120 according to the corresponding manufacturing process. In addition, for the sake of simplicity, not all scribe lines SL are marked one by one in FIG. 1. In addition, the approximate position of the scribe line SL or the cutting path corresponding thereto is schematically shown in FIG. 2.

Referring to FIGS. 2 to 6, a singulation process is performed on the stacked structure 101 (marked in FIG. 1 or FIG. 2) along the scribe line SL to form multiple quartz oscillators (such as FIG. 4, FIG. 5, FIG. 6, or FIG. 7). It is worth noting that, for the sake of simplicity, the first plate 110 is described later. That is to say, if necessary, the second plate 120 may also be subjected to the same or similar process that is subsequently performed on the first plate 110. In addition, for clarity, a zone R1 in FIG. 2 is enlarged for explanation in FIGS. 3 to 5. It is also worth noting that since the singulation process material basically has no obvious impact on the material and/or basically only has a direct impact on the size, the same or similar components use consistent names or labels before and after the singulation process to explain. The method of cutting is detailed below.

Figures 3, 4:
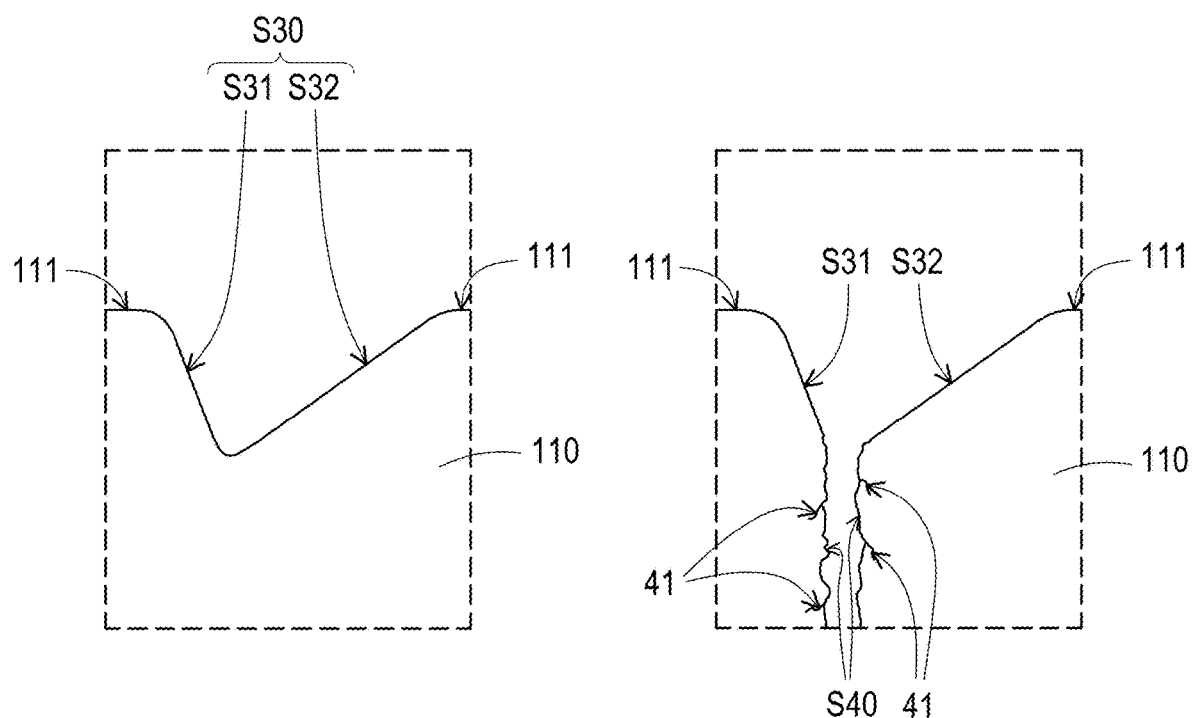

Referring to FIG. 2 to FIG. 3, part of the plate is removed through a first process. The first process essentially removes part of the plate from an outer surface thereof without forming grooves or openings therethrough. For example, as shown in FIG. 3, compared to FIG. 2, part of the first plate 110 along the scribe line SL may be removed from a first outer surface 111.

In an embodiment, the first process may include a wet etching process. Taking quartz material or glass material as an example, the wet etchant used may include fluorine-based solution (such as hydrogen fluoride aqueous solution, sodium fluoride aqueous solution, potassium fluoride aqueous solution, ammonium fluoride aqueous solution, ammonium bifluoride, or a mixture of the above). Compared with a mechanical drilling process or a powder blasting process, the wet etching process is less likely to cause corresponding damage or cracks during the etching process due to an impact of pressure or material. Compared with a laser drilling process, the wet etching process is less likely to cause corresponding damage or cracks during the etching process due to the impact of heat concentration (for example, heat is generated in a local area due to the absorption of laser light by the material) or material.

In an embodiment, a corresponding mask layer (not shown) may be formed or configured on the first outer surface 111 of the first plate 110. The mask layer may expose part of the first outer surface 111 (for example, corresponding to the scribe line SL), so as to be suitable for subsequent etching processes. In an embodiment, the aforementioned mask layer may be a patterned photoresist layer formed on the first plate 110. In an embodiment, the mask layer may be a preformed metal mask, and the pattern of the metal mask may be formed by an appropriate method (such as laser engraving). In addition, the metal mask may be configured on the first outer surface 111 of the first plate 110 through an appropriate method (such as adhesion).

In an embodiment, part of the second plate 120 along the scribe line SL may be removed from a second outer surface 122 thereof in the same or similar manner. For example, the mask layer may be formed or configured on the first outer surface 111 of the first plate 110 (at the top of the drawing) and on the second outer surface 122 of the second plate 120 (at the bottom of the drawing); then, the stacked structure similar to the stacked structure shown in FIG. 2 (i.e., the stacked structure 101 with the mask layer) is immersed in the wet etchant to remove a part of the first plate 110 and a part of the second plate 110 through the same process.

For monocrystalline materials, multiple lattice surfaces with specific directions may be defined by the orientation of a unit cell. Also, different lattice surfaces may have different etching rates. For a plate made of the quartz material, an etching surface S30 formed by the first process including the wet etching process has a profile on a cross-section (such as shown in FIG. 3) that is basically asymmetrical. For example, taking the first plate 110 made of the quartz material as an example, the etching surface S30 has a first part S31 and a second part S32. An angle between the first part S31 and the first outer surface 111 is larger than an angle between the second part S32 and the first outer surface 111. That is, the first part S31 is steeper than the second part S32. In an embodiment, for the first plate 110 made of the quartz material, one of the first part S31 or the second part S32 is parallel to a lattice surface of quartz.

In an embodiment, before subsequent processes are performed, at least the structure shown in FIG. 2 or FIG. 3 may be placed on an appropriate carrier.

Referring to FIG. 3 to FIG. 4, a second process is performed along the removed part of the plate. The second process may basically allow the stacked structure 101 to form multiple structures that are separated from each other.

In an embodiment, the first process basically does not include the wet etching process. The second process may include an appropriate dry etching process, mechanical cutting process, or slitting process. Since the previous process (such as the wet etching process) has removed part of the plate along the scribe line SL to form a corresponding thinner part, the second process may quickly form the plate-like or sheet-like stacked structure 101 into multiple structures that are smaller and separated from each other along the thinner part. In other words, an execution time of the second process is basically shorter than an execution time of the first process.

As shown in FIG. 4, compared with the etching surface S30 formed in FIG. 3, a separation surface S40 formed by the second process is rougher. That is, a roughness of the separation surface S40 is greater than a roughness of the etching surface S30.

In an embodiment, after completing the steps shown in FIG. 4, an appearance of the quartz oscillator may be roughly formed. That is to say, the structure shown in FIG. 4 may basically be regarded as a part of the quartz oscillator and/or has the basic function or purpose of the quartz oscillator.

Referring to FIGS. 4 and 5, in an embodiment, a third process may be performed so that the formed quartz oscillator has proper quality. However, it is worth noting that the disclosure does not limit the third process to be necessary.

In an embodiment, there may be corresponding damage or cracks 41 (such as shell-shaped fractures and agate patterns) on or in the separation surface S40 formed by the second process. Therefore, part of the plates 110, 120 and/or the quartz sheet 130 may be removed through the third process to reduce the number or degree of the damage or cracks 41, thereby improving a surface (such as: a side surface S4 formed by the separation surface S40). In this way, the quality of the quartz oscillator may be improved.

In one embodiment, the third process may include the wet etching process. Taking quartz material or glass material as an example, the wet etchant used in the third process may be similar to the wet etchant used in the first process. The difference is that the wet etchant used in the third process contains a lower concentration of fluoride ion; and/or, the implementation time of the wet etching process in the third process is shorter than the implementation time of the wet etching process in the first process.

In an embodiment, the third process may include a surface grinding process. For example, the separation surface S40 may be ground with appropriate sandpaper. In an embodiment, a number of the sandpaper (also referred to as: a grit size) may be greater than or equal to 400.

In addition, the third process may be able to reduce the number or sharpness of sharp corners in the corresponding materials (such as the first plate 110, the quartz sheet 130, and the second plate 120).

Figure 7:
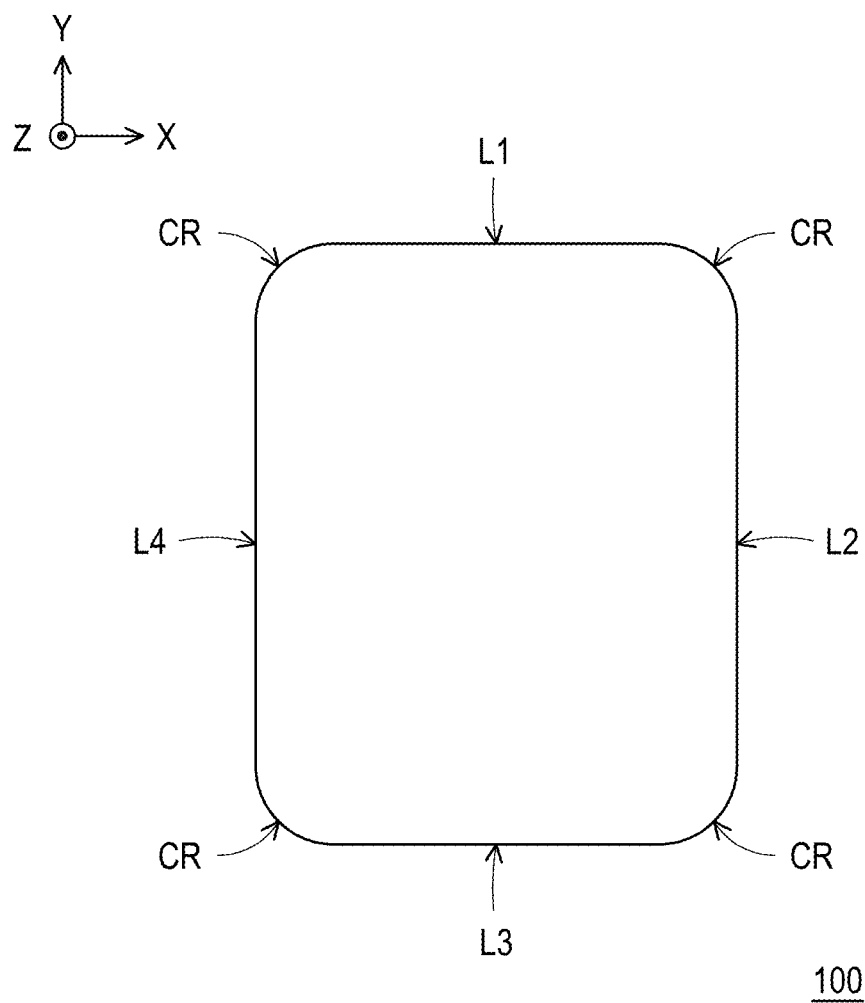
FIG. 7 is a schematic top view of a quartz oscillator according to an embodiment of the disclosure.

FIG. 6 is a schematic cross-sectional view of a quartz oscillator according to an embodiment of the disclosure. FIG. 7 is a schematic top view of a quartz oscillator according to an embodiment of the disclosure. In an embodiment, the quartz oscillator 100 may be manufactured by the same or similar manufacturing method as described above.

Referring to FIG. 6, the quartz oscillator 100 may include the first plate 110, the quartz sheet 130, and the second plate 120. The quartz sheet 130 is located between the first plate 110 and the second plate 120. The quartz sheet 130 has the oscillation zone 138a. The quartz oscillator 100 has the first outer surface 111, the side surface S4, and a first connection surface 113. The first outer surface 111 is located on the first plate 110. The first connection surface 113 is located between the first outer surface 111 and the side surface S4. The first outer surface 111, the side surface S4, and the first connecting surface 113 are not parallel to each other.

In an embodiment, the first plate 110 is made of quartz, and the first outer surface 111 is parallel to a lattice surface of the quartz material of the first plate 110.

In an embodiment, the quartz oscillator 100 has the second outer surface 122 and a second connection surface 123. The second outer surface 122 is located on the second plate 120. The second connection surface 123 is located between the second outer surface 122 and the side surface S4. The second outer surface 122, the side surface S4, and the second connection surface 123 are not parallel to each other.

In an embodiment, the second plate 120 is made of the quartz, and the second outer surface 122 is parallel to a lattice surface of the quartz material of the second plate 120.

In an embodiment, the side S4 is substantially perpendicular to the first outer surface 111 and/or the second outer surface 122. In an embodiment, the first outer surface 111 and the second outer surface 122 are substantially parallel to each other.

In an embodiment, in the top view state (as shown in FIG. 7), the quartz oscillator 100 has a first side L1, a second side L2, a third side L3, and a fourth side L4. The first side L1 is opposite to the third side L3. The second side L2 is opposite to the fourth side L4. The first side L1 is connected to the second side L2. The second side L2 is connected to the third side L3. The third side L3 is connected to the fourth side L4. The fourth side L4 is connected to the first side L1. There is basically a round corner CR between the two connected sides. A curvature of the round corner CR is greater than or equal to 1 micrometer (μm) (that is, the radius of curvature is greater than or equal to 1 micrometer).

To sum up, the manufacturing method of the quartz oscillator of the disclosure can make the manufactured quartz oscillator have proper quality or reliability; and/or the quartz oscillator of the disclosure has proper quality or reliability.

What is claimed is:

1. A quartz oscillator, comprising:
   a first plate made of monocrystalline quartz;
   a second plate made of monocrystalline quartz; and
   a quartz sheet, having an oscillation zone and located between the first plate and the second plate, wherein:
      the first plate has a first outer surface, a first side surface, and a first connection surface, the first connection surface is located between the first outer surface and the first side surface, and the first outer surface, the first side surface, and the first connection surface are not parallel to each other;
      the second plate has a second outer surface, a second side surface, and a second connection surface located between the second outer surface and the second side surface; and
      an angle between the second connection surface and the second outer surface is greater than an angle between the first connection surface and the first outer surface.

2. The quartz oscillator according to claim 1, wherein the first outer surface is parallel to a lattice surface of a quartz material of the first plate.

3. The quartz oscillator according to claim 1, wherein in a top view state, the quartz oscillator has a first side, a second side, a third side, and a fourth side, the first side is connected to the second side, the second side is connected to the third side, the third side is connected to the fourth side, and the fourth side is connected to the first side, and a rounded corner is formed between the first side and the second side, between the second side and the third side, between the third side and the fourth side, and between the fourth side and the first side.

4. The quartz oscillator according to claim 1, wherein the second outer surface, the second side surface, and the second connection surface are not parallel to each other.

5. The quartz oscillator according to claim 4, wherein the second outer surface is parallel to a lattice surface of a quartz material of the second plate.

6. A method for manufacturing a quartz oscillator, comprising:
   providing a stacked structure, comprising a first plate, a second plate, and a quartz sheet located between the first plate and the second plate, wherein each of the first plate and the second plate is made of monocrystalline quartz;
   sequentially performing a first process and a second process on the stacked structure such that an angle between a second connection surface and a second outer surface of the second plate becomes greater than an angle between a first connection surface and a first outer surface of the first plate, wherein:
      the first plate includes the first outer surface, a first side surface, and the first connection surface located between the first outer surface and the first side surface, and the first outer surface, the first side surface, and the first connection surface are not parallel to one another;
      the second plate includes the second outer surface, a second side surface, and the second connection surface located between the second outer surface and the second side surface;
      one of the first process and the second process comprises a wet etching process; and
      another one of the first process and the second process does not comprise the wet etching process.

7. The manufacturing method of the quartz oscillator according to claim 6, wherein the first process comprises the wet etching process, and the second process does not comprise the wet etching process.

8. The manufacturing method of the quartz oscillator according to claim 7, further comprising:
   performing a third process after the second process, wherein the third process comprises the wet etching process.

9. The manufacturing method of the quartz oscillator according to claim 6, wherein the first process does not comprise the wet etching process, and the second process comprises the wet etching process.

10. The manufacturing method of the quartz oscillator according to claim 6, wherein the wet etching process comprised in one of the first process and the second process forms an etching surface with an asymmetrical profile on an outer surface of the first plate or the second plate.

* * * * *